(12) United States Patent
Navarro

(10) Patent No.: US 10,854,673 B2
(45) Date of Patent: Dec. 1, 2020

(54) ELEMENTARY CELL COMPRISING A RESISTIVE RANDOM-ACCESS MEMORY AND A SELECTOR, STAGE AND MATRIX OF STAGES COMPRISING A PLURALITY OF SAID CELLS AND ASSOCIATED MANUFACTURING METHOD

(71) Applicant: Commissariat à l'Énergie Atomique et aux Énergies Alternatives, Paris (FR)

(72) Inventor: Gabriele Navarro, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 4 days.

(21) Appl. No.: 16/232,275

(22) Filed: Dec. 26, 2018

(65) Prior Publication Data

US 2019/0198570 A1 Jun. 27, 2019

(30) Foreign Application Priority Data

Dec. 26, 2017 (FR) ..................................... 17 63208

(51) Int. Cl.
*H01L 45/00* (2006.01)
*H01L 27/24* (2006.01)

(52) U.S. Cl.
CPC ...... *H01L 27/2427* (2013.01); *H01L 27/2409* (2013.01); *H01L 27/2463* (2013.01);
(Continued)

(58) Field of Classification Search
CPC ..... H01L 45/06; H01L 45/085; H01L 45/122; H01L 45/08
(Continued)

(56) References Cited

U.S. PATENT DOCUMENTS 8,830,739 B2 * 9/2014 Oh ........................ H01L 45/143
365/163
10,128,315 B2 * 11/2018 Russo .................... H01L 45/141
(Continued)

FOREIGN PATENT DOCUMENTS

EP 1801896 A1 6/2007
WO 2016043657 A1 3/2016

OTHER PUBLICATIONS

International Search Report and Written Opinion dated Sep. 4, 2018 in French Application 1763208.

*Primary Examiner* — David Vu
*Assistant Examiner* — Brandon C Fox
(74) *Attorney, Agent, or Firm* — Pillsbury Winthrop Shaw Pittman LLP

(57) ABSTRACT

An elementary cell includes a non-volatile resistive random-access memory mounted in series with a volatile selector device, the memory including an upper electrode, a lower electrode and a layer made of a first active material, designated memory active layer. The selector device includes an upper electrode, a lower electrode and a layer made of a second active material, designated selector active layer. The cell includes a one-piece conductor element including a first branch having one face in contact with the lower surface of the memory active layer in order to form the lower electrode of the memory, a second branch having one face in contact with the upper surface of the selector active layer in order to form the lower electrode of the memory.

11 Claims, 8 Drawing Sheets

(52) U.S. Cl.
CPC ............ *H01L 45/06* (2013.01); *H01L 45/08* (2013.01); *H01L 45/085* (2013.01); *H01L 45/122* (2013.01); *H01L 45/1233* (2013.01); *H01L 45/1253* (2013.01); *H01L 45/143* (2013.01); *H01L 45/144* (2013.01); *H01L 45/148* (2013.01); *H01L 45/1675* (2013.01); *H01L 45/1683* (2013.01)

(58) Field of Classification Search
USPC .......................................................... 257/4
See application file for complete search history.

(56) References Cited

U.S. PATENT DOCUMENTS

| | | |
|---|---|---|
| 2010/0163832 A1 | 7/2010 | Kau |
| 2010/0227438 A1 | 9/2010 | Ha |
| 2013/0270507 A1 | 10/2013 | Park et al. |
| 2014/0312296 A1 | 10/2014 | Jo et al. |
| 2015/0123066 A1 | 5/2015 | Gealy et al. |
| 2016/0005461 A1* | 1/2016 | Jo ...................... G11C 13/0002 365/148 |
| 2017/0243922 A1* | 8/2017 | Eun ...................... H01L 23/528 |
| 2018/0151623 A1* | 5/2018 | Terai ...................... C23C 16/34 |
| 2018/0286919 A1* | 10/2018 | Terai .................. H01L 45/1233 |
| 2018/0294408 A1* | 10/2018 | Yasuda ............. H01L 21/02178 |

\* cited by examiner

ELEMENTARY CELL COMPRISING A RESISTIVE RANDOM-ACCESS MEMORY AND A SELECTOR, STAGE AND MATRIX OF STAGES COMPRISING A PLURALITY OF SAID CELLS AND ASSOCIATED MANUFACTURING METHOD

CROSS-REFERENCE TO RELATED APPLICATIONS

This application claims priority to French Patent Application No. 1763208, filed Dec. 26, 2017, the entire content of which is incorporated herein by reference in its entirety.

FIELD

The technical field of the invention is that of non-volatile resistive random-access memories.

The present invention relates to an elementary cell comprising a resistive random-access memory and a selector, a stage comprising a plurality of the cells and a matrix comprising a plurality of the stages. The present invention also relates to the manufacturing method for obtaining the stage and the matrix.

BACKGROUND

For applications that require storage of information even when the voltage is cut, EEPROM or FLASH type non-volatile memories, which store charges on floating gates of field effect transistors, are conventionally used. These memories nevertheless have drawbacks:

long writing times (several microseconds),
limited density because the reduction in size of the transistors leads to a decrease in the reading signal, that is to say a lowering of the difference between the two states of the memory point, and a reduction in the duration of the information retention,
limited number of writing cycles because the capacity to retain information decreases as the writing cycles proceed on account of the creation of defects in the gate oxide of the transistors, allowing electrons to escape from the floating gate.

Thus, this type of memory does not have the characteristics required to support the development of new technologies such as SCMs (Storage Class Memories) which are experiencing a significant surge notably thanks to their capacity to enhance the performances of computers while reducing the consumption thereof.

More recently, other types of rewritable non-volatile memories have appeared, based on active materials such as ion conducting materials (CBRAMs or Conductive Bridging RAMs), metal oxides materials (OxRAMs or Oxide Resistive RAMs), ferroelectric materials (FERAMs or Ferroelectric RAMs), magnetic materials (MRAMs or Magnetic RAMs), magnetic materials with spin transfer (STTRAMs or Spin Torque Transfer RAMs) or materials with phase change (PCRAMs or Phase Change RAMs). These memories are resistive type memories (that is to say that they can have at least two states "OFF" or "ON" corresponding to the passage from a resistive state ("OFF" state) to a less resistive state ("ON" state)).

Resistive random-access memories need two electrodes to operate. For example, CBRAMs comprise an active zone based on an ion conducting material forming a solid electrolyte with ionic conduction arranged between an electrode forming an inert cathode and an electrode comprising a portion of ionisable metal, that is to say a portion of metal being able to form metal ions easily, and forming an anode. The operation of CBRAMs is based on the formation, within the solid electrolyte, of one or more metal filaments (also called "dendrites") between its two electrodes when these electrodes are taken to suitable potentials. The formation of the filament enables to obtain a given electrical conduction between the two electrodes. By modifying the potentials applied to the electrodes, it is possible to modify the distribution of the filament, and thereby to modify the electrical conduction between the two electrodes.

PCRAMs comprise an active zone based on a chalcogenide material. The operation of PCRAMs is based on the phase transition of the chalcogenide material, induced by the heating of this material under the effect of specific electrical pulses generated by its two electrodes. This transition takes place between an ordered crystalline phase, of low resistance and thermodynamically stable, and a disordered amorphous phase, of high resistance and thermodynamically unstable.

Resistive random-access memories notably have the interest of being able to be integrated with high densities, via a "cross-bar" (also designated "cross-point") type integration.

Such an architecture 200 is illustrated in FIG. 1 and comprises a plurality of access lines 201, 202, 203 and 204 and a plurality of memory cells (here four cells C11, C21, C22 and C12) of non-volatile rewritable type based on active materials (for example CBRAM cells). The access lines are formed by upper parallel bit lines 201 and 202, and lower word lines 203 and 204 perpendicular to the bit lines, the elementary cells C11, C21, C22 and C12 being sandwiched at the intersection between the bit lines 201 and 202 and the word lines 203 and 204. The architecture 200 thereby forms an array where each memory cell may be addressed individually, by selecting the correct bit line and the correct word line.

This type of architecture nevertheless has certain drawbacks. Thus, the phase of reading the state of a cell is carried out by polarisation of the desired line and column; it is then possible to observe a parasitic leakage current flowing through adjacent cells. The hypothesis is here made that:

The cell C11 is in the OFF state (high resistance state);
The cell C21 is in the ON state (low resistance state);
The cell C22 is in the ON state (low resistance state);
The cell C12 is in the ON state (low resistance state).

The reading of the resistive state of the cell C11 involves polarising respectively the bit line 201 and the word line 204 (application of a potential difference Vbias between these two lines). In theory, the measuring current should circulate uniquely along the arrow 205 represented in dotted lines. In practice, due to the fact that the three other cells are in the ON state, a parasitic leakage current, represented by the arrow 206, flows through the non-resistive cells C21, C22 and C12. This leakage current, in particular in the unfavourable case where the adjacent elements of the cell to measure are in the ON state, may perturb the measurement up to preventing the discrimination between the ON state and the OFF state of the cell to measure.

One known solution to this problem consists in adding, in series with each of the cells, a p/n junction diode 207 to play the role of selector. Such an architecture 300 is illustrated in FIG. 2. Common elements bear the same reference numbers in FIGS. 1 and 2, it being understood that the cells C11, C21, C22 and C12 of FIG. 2 are in the same resistive state as the cells C11, C21, C22 and C12 of FIG. 1. In this case, the diodes 207 being unipolar, they block the passage of the parasitic current, thereby authorising uniquely the current represented by the arrow 210 induced by the polarisation of the bit line 201 and the word line 204 (application of a potential difference Vbias between these two lines).

The architecture as illustrated in FIG. 2 also poses however certain difficulties linked in particular to the fact that the diodes have current intensities in the ON mode that remain limited. Thus, at present, for a given silicon surface area, it is not possible to produce a diode of same surface area as the memory cell and having a sufficient ON current ION (too low current density of the diodes) and at the same time a quite low leakage current $I_{OFF}$. Such a situation notably poses serious difficulties in the case of the use of a diode in series with a PCRAM phase change type cell which requires significant switching currents.

That is why several alternative solutions have been studied over recent years. In the literature, different types of selector are found such as FAST (Field Assisted Superlinear Threshold), MIEC (Mixed-Ionic-Electronic Conduction) and OTS (Ovonic Threshold Switching).

A selector device is composed of two electrodes and an active material, the electrodes being arranged on either side of the active material and making it possible to apply a voltage to the active material. In the case of an OTS type selector, the active material may be a chalcogen alloy. The basic principle of the operation of a selector device is represented in FIG. 3. The device is highly resistant in the OFF state. As soon as a voltage above a threshold voltage is applied thereto, the current increases rapidly to reach the ON state of the device, a low resistance state. As soon as the current or the voltage is reduced below a specific value designated "holding" value, the device returns to OFF.

In order to be able to be integrated with a resistive random-access memory, a selector has to have several specificities. Indeed, it has to have:
  a dimension close to that of the co-integrated memory;
  a low leakage current $I_{OFF}$: when the selector is in its "OFF" state thus with low field, the resistance of the selector must be very high. This characteristic can be attained by reducing, for example, the contact surface between the selector and its upper electrode or by increasing the thickness of the active material of the selector, the thickness of the active material of the selector being the dimension of the active material of the selector along a direction orthogonal to the plane formed by the contact surface between the selector and its upper electrode;
  a low threshold voltage: this is obtained by reducing on the contrary the thickness of the active material of the selector.

To further improve the integration density of resistive random-access memories, a conventional solution is to decrease the size of the surface area between the active material of the resistive random-access memory and its lower electrode to enable a reduction in the programming current of the resistive random-access memory.

Thus, in general, both for the memory device and for the selector, the reduction in the surface area, notably the contact surface area between the selector and its upper electrode and the contact surface area between the active material of the memory and its lower electrode, makes it possible to respond to all the sought-after characteristics, namely:
  reduction in the size of the complete device, which will hereafter be designated by the term "elementary cell";
  reduction in the leakage current $I_{OFF}$;
  reduction in the programming current of the memory;
  increase in the integration density of the memory.

The integration proposed in this invention is in particular dedicated to co-integration between a PCRAM and OTS selector, but it can extend to other types of resistive random-access memories such as OxRAM or CBRAM and other types of selectors such as FAST and MIEC.

One solution for reducing both the surface area of the OTS selector and the PCRAM is described in the patent US20150123066A1. This patent proposes etching the two devices at the same time by carrying out lithographic operations in the two directions of the plane. This solution has numerous drawbacks, of which the most important are:
  the need for a very aggressive lithography to reach reasonably low leakage and programming currents;
  a mechanical problem of stability of the structures after etching;
  the need for an etching chemistry able to etch the two PCM and OTS materials, without damaging one while etching the other, which leads to a limitation in the choice of the composition of the materials.

There thus exists a need to reduce the dimensions of the OTS selector and to reduce the contact surface area between the PCRAM and its lower electrode within a device having a "cross-bar" type architecture, without the device encountering problems of stability at the end of its manufacture and without limiting the choice of its constituent materials.

SUMMARY

An aspect of the invention offers a solution to the aforementioned problems by proposing an elementary memory cell suitable for being integrated in a device with a "cross-bar" type architecture having a selector and a contact surface area between the memory cell and its lower electrode of reduced dimensions with respect to conventional "cross-bar" structures while not limiting the choice of materials and not degrading the stability of the final device.

A first aspect of the invention relates to an elementary cell comprising a non-volatile resistive random-access memory mounted in series with a volatile selector device, the memory comprising:
  an upper electrode of the resistive random-access memory,
  a lower electrode of the resistive random-access memory,
  a layer made of a first active material, designated memory active layer,
the memory going from a high resistance state to a low resistance state by application of a threshold voltage between the upper electrode of the resistive random-access memory and the lower electrode of the resistive random-access memory, the selector device comprising:
  an upper electrode of the selector device,
  a lower electrode of the selector device,
  a layer made of a second active material, designated selector active layer,
the selector device going from a high resistance state to a low resistance state by application of a threshold voltage between the upper electrode of the selector device and the lower electrode of the selector device, the selector device returning to the high resistance state as soon as the current flowing though it or the voltage at the terminals of the upper electrode of the selector device and the lower electrode of the selector device returns respectively below a holding current or voltage,
the cell comprising a one-piece conductor element comprising:
  a first branch of substantially rectangular parallelepiped shape, the first branch having one face in contact with the lower surface of the memory active layer in order to form the lower electrode of the resistive random-access memory, a second branch of substantially rectangular parallelepiped shape, the second branch having one face in contact with the upper surface of the selector active layer in order to form the upper electrode of the selector device.

Thanks to the invention, the dimensions of the selector device are defined by:

the dimensions of the second branch of the one-piece conductor element;

the thickness of the selector active layer, that is to say the dimension of the selector active layer along a direction orthogonal to the plane defined by the contact surface between the selector active layer and the second branch of the one-piece conductor element.

The dimensions of the contact surface between the memory and its lower electrode are defined by the dimensions of the first branch of the one-piece conductor element.

The dimensions of the two branches of the one-piece conductor element being independent of each other, issues regarding the reduction in the contact surface between the memory and its lower electrode are dissociated from issues regarding the reduction in the dimensions of the selector device, which makes it possible not to limit the choice of materials. In addition, this avoids having to etch the resistive random-access memory and the selector device at the same time, which would destabilise the final device.

Apart from the characteristics that have been described in the previous paragraph, the elementary cell according to an aspect of the invention may have one or more additional characteristics among the following, considered individually or according to all technically possible combinations thereof.

Beneficially, the selector device comprises a one-piece selector element comprising:

a first branch of substantially rectangular parallelepiped shape, the first branch having one face in contact with one face of the first branch of the one-piece conductor element, a second branch of substantially rectangular parallelepiped shape constituted of the selector active layer, in such a way that the one-piece selector element hugs the outer contours of the one-piece conductor element.

Thus, the first branch of the one-piece selector element enables better isolation of the one-piece conductor element.

Beneficially, the angle between the two branches of the one-piece conductor element is substantially a right angle.

Beneficially, the selector device is of OTS, FAST or MIEC type.

Beneficially, the resistive random-access memory is of PCRAM, OxRAM or CbRAM type.

Beneficially, a stage comprises a plurality of cells according to a first aspect of the invention distributed along several straight lines parallel with each other.

Beneficially, a matrix comprises a plurality of stages laid out one on top of the other and the direction of the straight lines along which are distributed the cells of a stage alternate from one stage to the next in such a way that the direction of the straight lines of a stage is perpendicular to the direction of the straight lines of the stage immediately below and/or above.

Thus, the stage and the matrix of stages make it possible to integrate resistive random-access memories with high densities. In addition, it enables a compact integration of the cells.

A second aspect of the invention relates to a method for manufacturing a stage comprising:

a step of conformal deposition of a conductor material layer of the lower electrode of the selector device on a substrate then of conformal deposition of a first dielectric material layer on the conductor material layer of the lower electrode of the selector device;

a step of etching a plurality of trenches parallel with each other in the first dielectric material layer with stoppage on the conductor material layer of the lower electrode of the selector device;

a step of conformal deposition of a selector active layer in order to cover the trenches and the parts of the first dielectric material layer that have not been etched during the etching step, then of conformal deposition of a material layer of the one-piece conductor element on the selector active layer then of conformal deposition of a second dielectric layer on the material layer of the one-piece conductor element, in such a way that the trenches are not filled;

a step of anisotropic etching along the direction of the trenches with stoppage on the conductor material layer of the lower electrode of the selector device at the bottom of the trenches and with stoppage on the parts of the first dielectric material layer not having been etched during the etching step in order to obtain each one-piece conductor element of the elementary cells;

a step of filling with a third dielectric material layer so as to fill the trenches;

a step of lithography producing several lithographic trenches along a direction perpendicular to the direction of the trenches etched previously and in the plane of the third dielectric material layer, with stoppage on the substrate;

a step of filling with a fourth dielectric material layer so as to fill the lithographic trenches;

a step of planarization with stoppage on the parts of the first dielectric material layer not having been etched;

a step of conformal deposition of a memory active layer then of conformal deposition of a conductor material layer of the upper electrode of the resistive random-access memory on the memory active layer.

Thus, the method according to a second aspect of the invention makes it possible to obtain a stage of cells according to a first aspect of the invention.

Beneficially, a method for manufacturing a matrix reproduces the same steps as the method according to a second aspect of the invention for each stage of the matrix in such a way that the direction of the trenches of a stage is perpendicular to the direction of the trenches of the stage immediately below and/or above.

Thus, this method makes it possible to obtain a matrix of stages of cells according to a first aspect of the invention.

Beneficially, a method for manufacturing a matrix of stages of cells according to a first aspect of the invention comprises a step of etching several final trenches along the direction of the trenches etched at the etching step for producing the final stage, etching of final trenches in the memory active layer and the conductor material layer of the upper electrode of the resistive random-access memory of the final stage so as to only conserve the memory active layer and the conductor material layer of the upper electrode of the resistive random-access memory at the level of the contact surfaces between the memory active layer and the material layer of the one-piece conductor element.

A third aspect of the invention relates to a method for manufacturing at least one elementary cell comprising a non-volatile resistive random-access memory mounted in series with a volatile selector device, the memory comprising:
an upper electrode of the resistive random-access memory,
a lower electrode of the resistive random-access memory,
a layer made of a first active material, designated memory active layer,
the memory going from a high resistance state to a low resistance state by application of a threshold voltage between the upper electrode of the resistive random-access memory and the lower electrode of the resistive random-access memory, the selector device comprising:
an upper electrode of the selector device,
a lower electrode of the selector device,
a layer made of a second active material, designated selector active layer,
the selector device going from a high resistance state to a low resistance state by application of a threshold voltage between the upper electrode of the selector device and the lower electrode of the selector device, the selector device returning to the high resistance state as soon as the current flowing through it or the voltage at the terminals of the upper electrode of the selector device and the lower electrode of the selector device returns respectively below a holding current or voltage,
the method comprising the following steps:
a step of conformal deposition of a conductor material layer of the lower electrode of the selector device on a substrate then of conformal deposition of a first dielectric material layer on the conductor material layer of the lower electrode of the selector device;
a step of etching at least one trench, the trenches being parallel with each other, in the first dielectric material layer with stoppage on the conductor material layer of the lower electrode of the selector device;
a step of conformal deposition of a selector active layer in order to cover each trench and the parts of the first dielectric material layer that have not been etched during the etching step, then of conformal deposition of a material layer of the one-piece conductor element on the selector active layer then of conformal deposition of a second dielectric layer on the material layer of the one-piece conductor element, in such a way that each trench is not filled;
a step of anisotropic etching along the direction of the trench(es) with stoppage on the conductor material layer of the lower electrode of the selector device at the bottom of the trench(es) and with stoppage on the parts of the first dielectric material layer not having been etched during the etching step in order to obtain at least one one-piece conductor element;
a step of filling with a third dielectric material layer so as to fill the trenches;
a step of lithography producing at least one lithographic trench along a direction perpendicular to the direction of the trench(es) etched previously and in the plane of the third dielectric material layer, with stoppage on the substrate;
a step of filling with a fourth dielectric material layer so as to fill the lithographic trench(es);
a step of planarization with stoppage on the parts of the first dielectric material layer not having been etched;
a step of conformal deposition of a memory active layer then of conformal deposition of a conductor material layer of the upper electrode of the resistive random-access memory on the memory active layer.

The invention and its different applications will be better understood on reading the description that follows and by examining the figures that accompany it.

BRIEF DESCRIPTION OF THE FIGURES

The figures are presented for indicative purposes and in no way limit the invention.

DETAILED DESCRIPTION

Unless stated otherwise, a same element appearing in different figures has a single reference.

Figure 1:
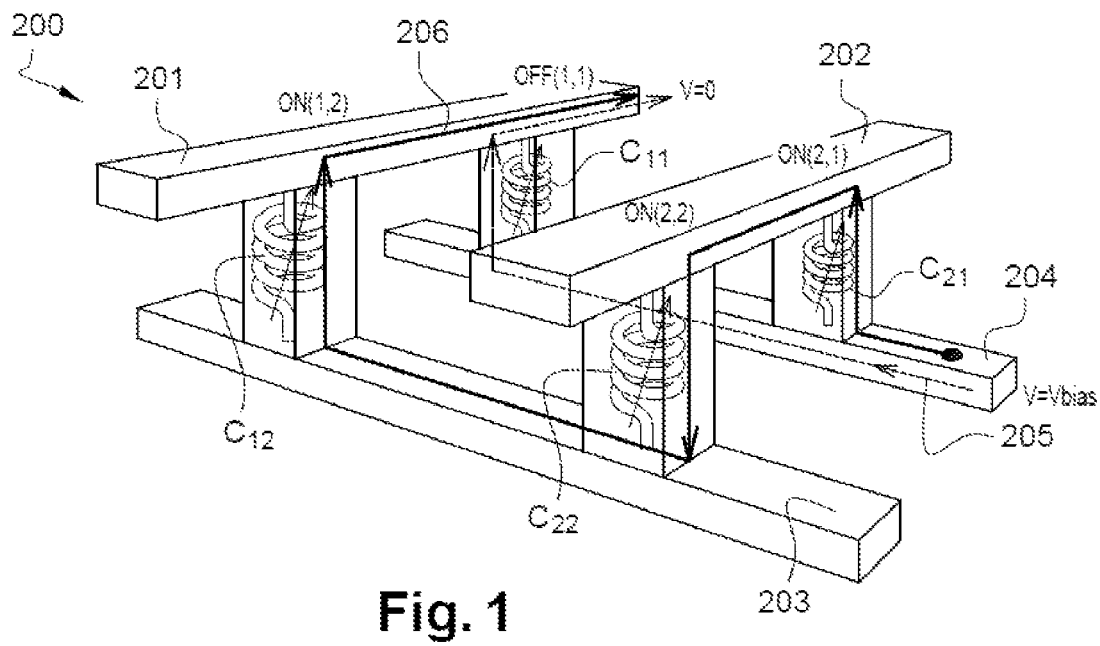
FIG. 1 represents a first architecture for addressing a plurality of memory cells according to the prior art.
Figure 2:
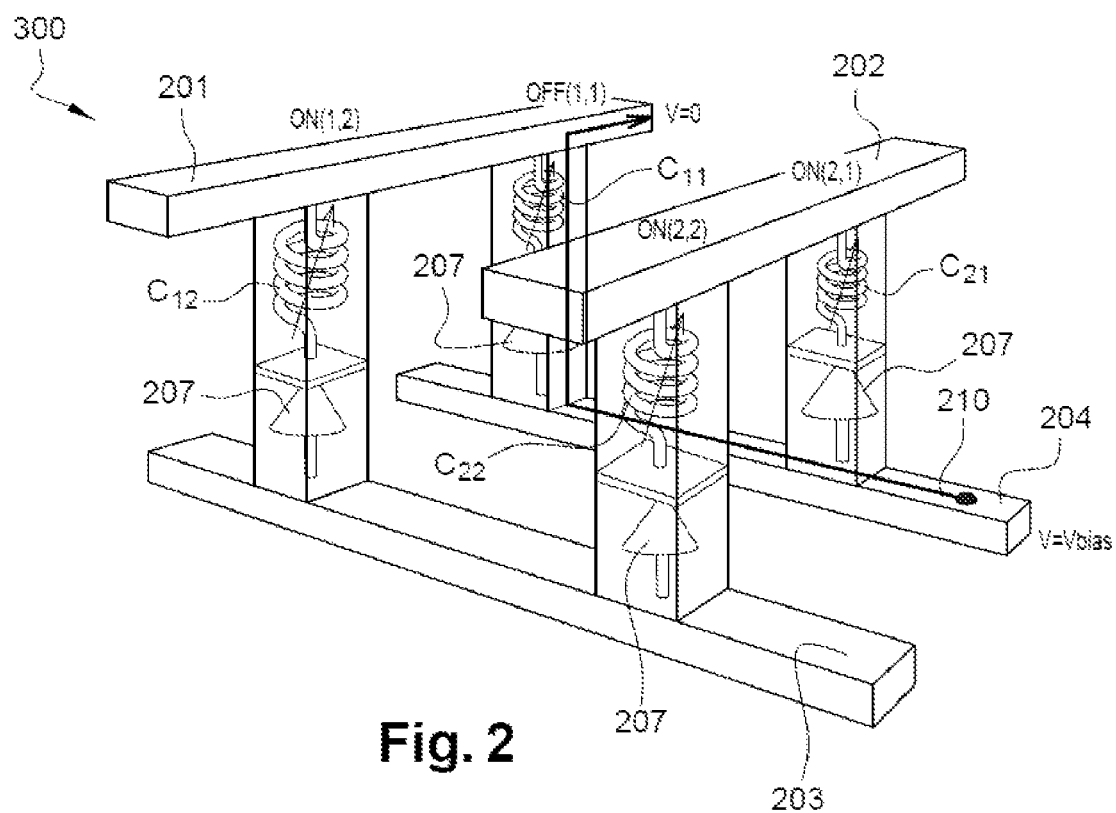
FIG. 2 represents a second architecture of a plurality of memory cells according to the prior art.
Figure 3:
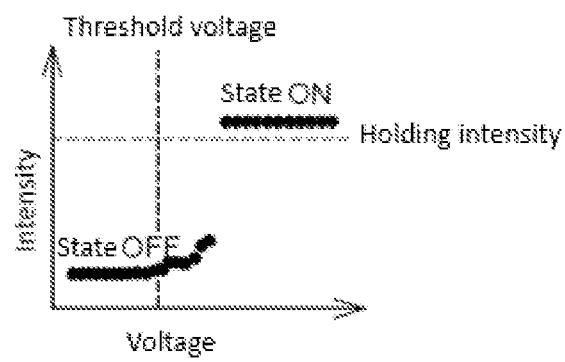
FIG. 3 shows a graph explaining the operating principle of a selector device.

FIGS. 1 to 3 have already been described with reference to the prior art.

Figure 4:
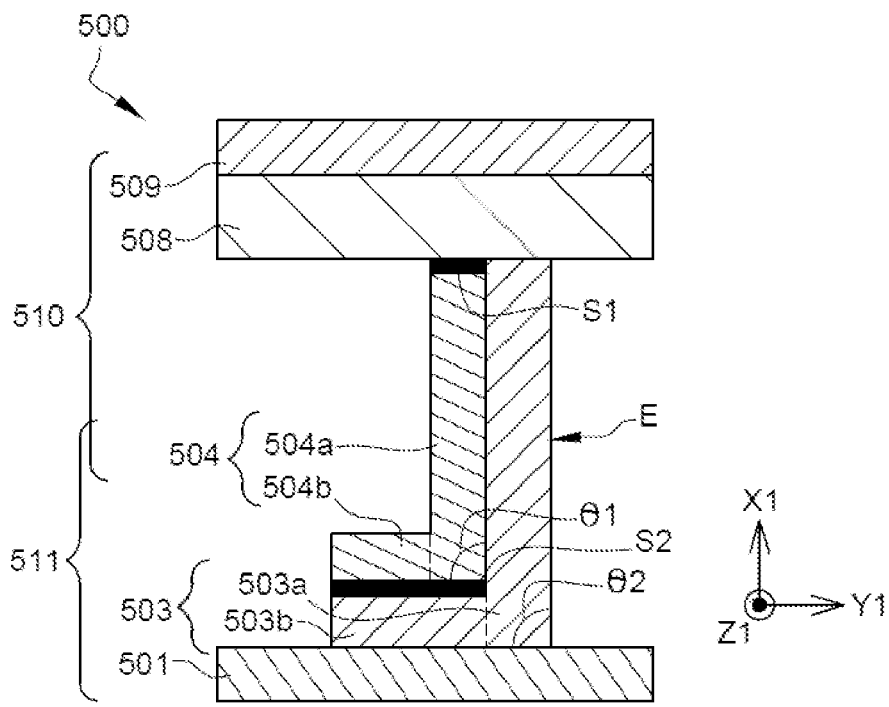
FIG. 4 shows a 2D schematic representation of an electronic elementary cell according to a first aspect of the invention.

A first aspect of the invention illustrated in FIG. 4 relates to an elementary cell 500 enabling the addressing of a non-volatile resistive random-access memory 510 when it is integrated within a cross-bar type architecture.

The elementary cell 500 comprises:
A conductor material layer of the upper electrode of the resistive random-access memory 509;
A layer made of a first active material, designated memory active layer 508;
A one-piece conductor element 504 comprising:
A first branch 504a forming the lower electrode of the resistive random-access memory 510;
A second branch 504b forming the upper electrode of the selector device 511;
A one-piece selector element 503 comprising:
A first branch 503a;
A layer made of a second active material, designated selector active layer forming a second branch 503b;
A conductor material layer of the lower electrode of the selector device 501.

The first active material is able to form a resistive random-access memory 510 and the second active material is able to form a selector device 511, the selector device 511 and the resistive random-access memory 510 each requiring an upper electrode and a lower electrode to ensure their operation.

An upper electrode of a device is defined as the electrode situated above the device and the lower electrode of a device is defined as the electrode situated below the device, the electrodes being situated on either side of the device. Obviously, the adjectives "upper" and "lower" are here relative to the orientation of the assembly including the upper electrode, the device and the lower electrode so that in turning over this assembly, the electrode previously qualified as upper becomes the lower electrode and the electrode previously qualified as lower becomes the upper electrode.

The one-piece conductor element 504 comprises two branches 504a and 504b having a substantially rectangular parallelepiped shape. The two branches 504a and 504b are laid out so as to have an "L" shape. In an embodiment, the angle θ1 between these two branches is comprised between 70 and 110° and for example between 90° and 110°. In another embodiment, the angle θ1 between these two branches is substantially a right angle, as represented in FIG. 4, the first branch 504a defining a direction $\vec{X1}$ and the second branch 504b defining a direction $\vec{Y1}$. A direction $\vec{Z1}$ then makes it possible to define an orthogonal reference frame ($\vec{X1}$, $\vec{Y1}$, $\vec{Z1}$). The layers extend along a plane containing the directions $\vec{Y1}$ and $\vec{Z1}$. In an embodiment, the dimension of the first branch 504a of the one-piece conductor element 504 along the direction $\vec{X1}$ is equal to or greater than the dimension of the second branch 504b of the one-piece conductor element 504 along the direction $\vec{Y1}$.

The one-piece selector element 503 also has an "L" shape with two branches 503a and 503b. In an embodiment, the angle θ2 between these two branches is comprised between 70 and 110° and in another embodiment between 90° and 110°. In an embodiment, the angle θ2 between these two branches is substantially a right angle, as represented in FIG. 4, a first branch 503a of the one-piece selector element 503 being along the direction $\vec{X1}$ and having a dimension along the direction $\vec{X1}$ strictly greater than the dimension of the first branch 504a of the one-piece conductor element 504 along the direction $\vec{X1}$ and a second branch 503b of the one-piece selector element 503 being along the direction $\vec{Y1}$ and having a dimension along the direction $\vec{Y1}$ strictly greater than the dimension of the second branch 504b of the one-piece conductor element 504 along the direction $\vec{Y1}$. In an embodiment, the dimension of the first branch 503a of the one-piece selector element 503 along the direction $\vec{X1}$ is equal to or greater than the dimension of the second branch 503b of the one-piece selector element 503 along the direction $\vec{Y1}$.

The one-piece conductor element 504 and the one-piece selector element 503 are laid out so as to form a single "L", the one-piece selector element 503 fitting the outlines of the "L" which constitutes the one-piece conductor element 504. The assembly E formed of the one-piece conductor element 504 and the one-piece selector element 503 thus comprises two assembly branches being substantially perpendicular, a first assembly branch being along the direction $\vec{X1}$ and having a dimension along the direction $\vec{X1}$ equal to the dimension of the first branch 503a of the one-piece selector element 503 along the direction $\vec{X1}$ and a second assembly branch being along the direction $\vec{Y1}$ and having a dimension along the direction $\vec{Y1}$ equal to the dimension of the second branch 503b of the one-piece selector element 503 along the direction $\vec{Y1}$.

The conductor material layer of the upper electrode of the resistive random-access memory 509 and the assembly E including the one-piece conductor element 504 and the one-piece selector element 503 are situated on either side of the memory active layer 508, the assembly E being in contact with the memory active layer 508 at the level of the end of the first assembly branch, along a plane containing the directions $\vec{Y1}$ and $\vec{Z1}$.

The memory active layer 508 is thus in contact with a lower electrode at the level of the contact surface S1 between the memory active layer 508 and the end of the first branch 504a of the one-piece conductor element 504 and with an upper electrode at the level of the contact surface between the memory active layer 508 and the conductor material layer of the upper electrode of the resistive random-access memory 509, the assembly formed by the one-piece conductor element 504 of the memory active layer 508 and the conductor material layer of the upper electrode of the resistive random-access memory 509 forming a resistive random-access memory 510.

The assembly E is in contact with the conductor material layer of the lower electrode of the selector device 501 at the level of the face of the assembly E defined along a plane containing the direction $\vec{Y1}$ and $\vec{Z1}$, the furthest from the memory active layer 508.

The one-piece selector element 503 is thus in contact with an upper electrode at the level of the contact surface S2 between the second branch 503b of the one-piece selector element 503 and the second branch 504b of the one-piece conductor element 504 and with a lower electrode at the level of the contact surface between the second branch 503b of the one-piece selector element 503 and the conductor material layer of the lower electrode of the selector device 501, the assembly formed by the one-piece conductor element 504, the one-piece selector element 503 and the conductor material layer of the lower electrode of the selector device 501 forming the selector device 511.

The one-piece selector element 503 may not have an "L" shape. Indeed, only the second branch or selector active layer 503b, in contact both with the one-piece conductor element 504 and the conductor material layer of the lower electrode of the selector device 501 participates in the operation of the selector device 511. The first branch 503a of the one-piece selector element 503 is not involved in the operation of the cell 500 but, the material of the first branch 503a being not very conductive, it enables better isolation of the one-piece conductor element 504.

The material of the memory active layer 508 is chosen as a function of the desired type of memory, for example, a PCRAM, OxRAM or CBRAM type memory: this choice then conditions the choice of the conductor materials of the electrodes of the memory. Indeed, for example, in order that a CBRAM operates, it has to have two electrodes arranged on either side of its active material with ionic conduction, of which one electrode comprising a portion of ionisable metal, that is to say a portion of metal being able to form metal ions easily.

The material of the one-piece conductor element 503 is chosen as a function of the desired type of selector device, for example, an OTS, FAST or MIEC type selector. For a PCRAM, the material of the memory active layer 508 is for example GeSbTe, SbTe or GeTe. For an OTS selector, the material of the one-piece conductor element 503 is for example GeSe, GeSiAsSe, GeSiAsTe, AsTe or GeSeSbN.

In the case of an OTS type selector and of a PCRAM type resistive random-access memory, the material used for the one-piece conductor element 504 is for example TiN, TaN, W, TiWN, TiSiN or WN.

Thus, the contact surface area between the memory active layer 508 and the lower electrode of the resistive random-access memory 510 depends on the dimension along the direction $\vec{Y1}$, on the end of the first branch 504a of the one-piece conductor element 504 and the dimensions of the selector device 511 depend on the dimension along the direction $\vec{Y1}$, on the face of the second branch 504b of the one-piece conductor element 504 extended along a plane containing the directions $\vec{Y1}$ and $\vec{Z1}$, the furthest from the memory active layer 508, and on the dimension along the direction $\vec{X1}$ of the second branch 503b of the one-piece conductor element 503. The "L" shape of the one-piece conductor element 504 thus makes it possible to dissociate problems linked to the reduction in the contact surface between the resistive random-access memory 510 and its lower electrode from those of the reduction in the dimensions of the selector device 511.

FIGS. 5 to 14 illustrate the different steps 401 to 412 (flow diagram of FIG. 15) of the method 400 for the production of one or more stages 600, each stage 600 integrating a plurality of cells 500 according to the invention.

Figure 13:
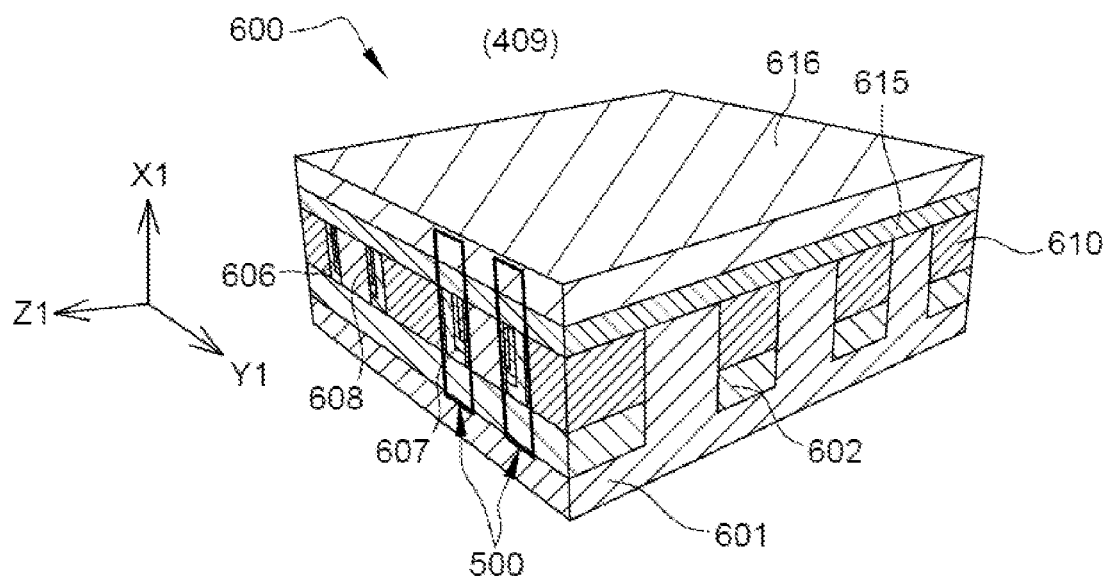

The method 400 makes it possible to manufacture a stage 600 referenced in FIG. 13 comprising a plurality of elementary cells 500 according to a first aspect of the invention and consistent with the cell 500 of FIG. 4, the stage 600 being, in an embodiment, of rectangular parallelepiped shape.

Figure 5:
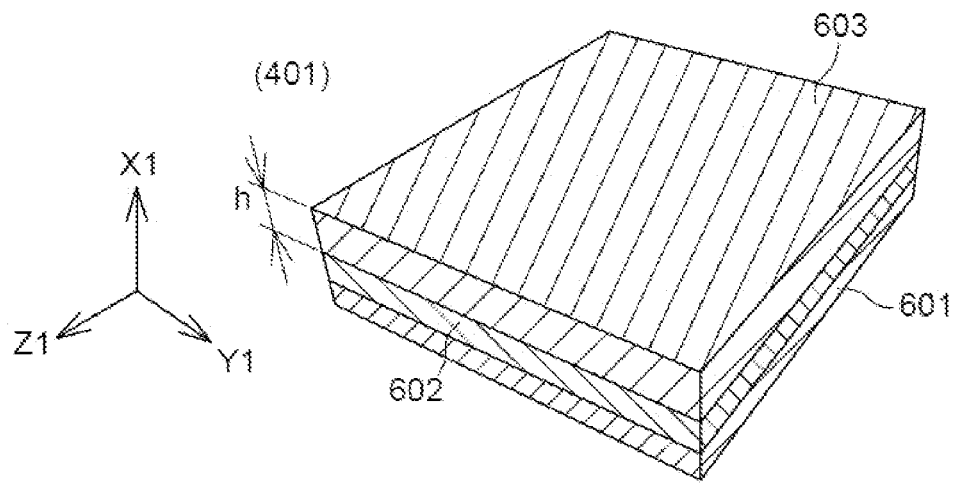
FIGS. 5 to 14 illustrate the different steps of the method for manufacturing one or more stages integrating a plurality of cells according to FIG. 4.

The deposition step 401 represented in FIG. 5 consists in carrying out a conformal deposition of a conductor material layer of the lower electrode of the selector device 602 on a substrate 601, then a conformal deposition of a first dielectric material layer 603 on the conductor material layer of the lower electrode of the selector device 602, conformal deposition signifying that the material is deposited in a uniform manner on the whole of the surface of the substrate 601 defining the surface on which will be formed the stage 600. The substrate 601 is constituted of one or more layers: it includes, for example, a layer with exposed copper lines making it possible to establish metal contacts with an upper metal layer, not represented here. It thus includes all the logic required to enable connection with the lines of the upper layers. The plane along which extends the substrate 601 contains the direction $\vec{Y1}$ and the direction $\vec{Z1}$. The orthogonal reference frame ($\vec{X1}$, $\vec{Y1}$; $\vec{Z1}$) defines the sides of the stage 600 if it is of rectangular parallelepiped shape. The dimension of the layers along the direction $\vec{X1}$ is called thickness. Thus, the first dielectric material layer 603 has a thickness "h".

The dielectric material of the first dielectric material layer 603 is for example SiN, $SiO_2$, SiC, SiON, SiCN or SiHN. The depositions of this step, like those of the following steps, may be CVDs (Chemical Vapour Depositions) or ALDs (Atomic Layer Depositions).

Figure 6:
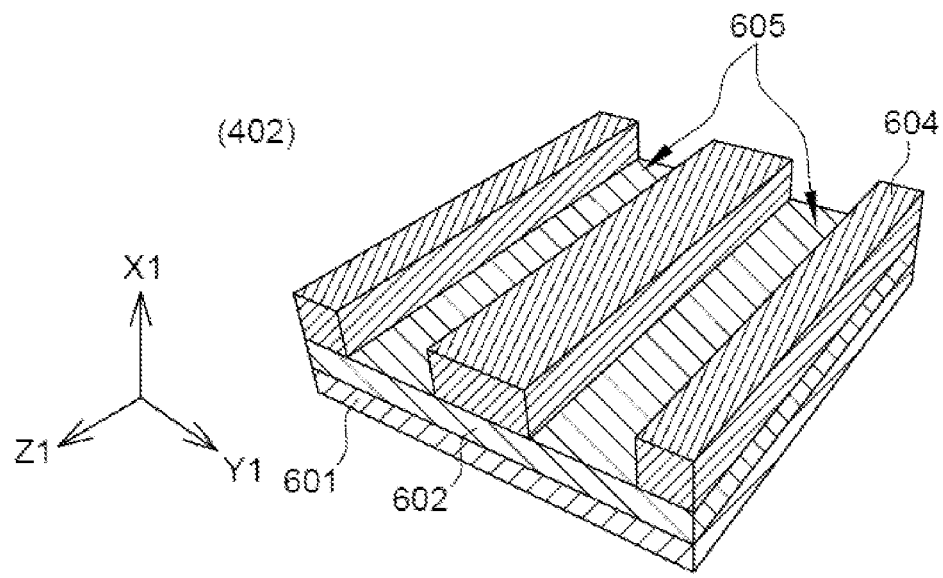

The etching step 402 represented in FIG. 6 consists in etching several trenches 605 in the first dielectric material layer 603 with stoppage on the conductor material layer of the lower electrode of the selector device 602. The etching is for example carried out by photoetching. The trenches 605 are here along the direction $\vec{Z1}$. The trenches 605 are all parallel with each other. A trench 605 is etched in such a way that the edges of the trench 605 are substantially of same height and that the sides of the trench 605 are comprised in planes orthogonal to the bottom of the trench 605 containing the direction $\vec{X1}$ and substantially parallel with each other. The etching depth is substantially the same for all the trenches 605.

Figure 7:
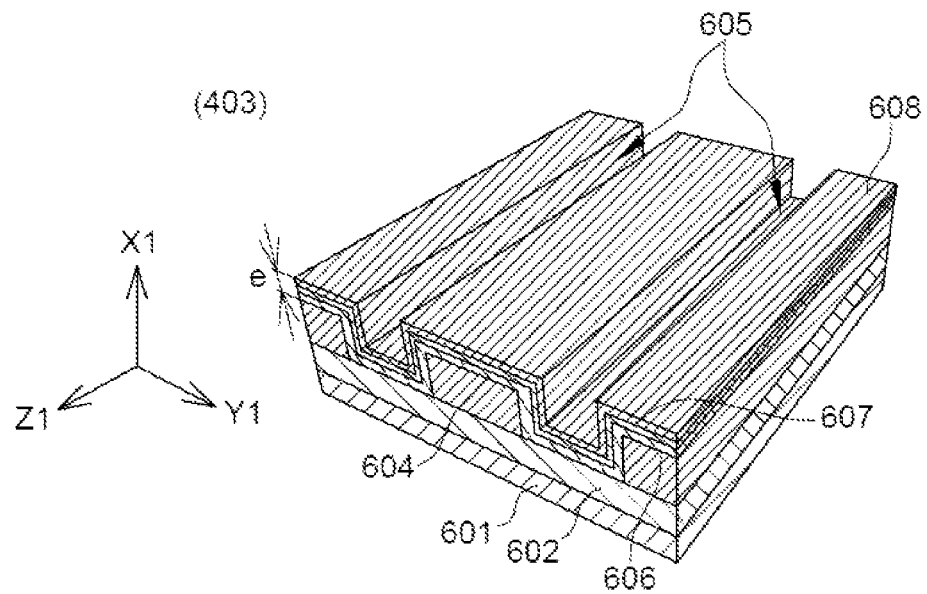

The deposition step 403 is represented in FIG. 7. Firstly, a selector active layer 606 is deposited in a conformal manner that is to say on the trenches etched at the etching step 402 and on the parts 604 of the first dielectric material layer not having been etched at the etching step 402. Next, a material layer of the one-piece conductor element 607 is deposited in a conformal manner on the selector active layer 606, then a second dielectric material layer 608 is deposited in a conformal manner on the material layer of the one-piece conductor element 607. The sum of the thickness of the selector active layer 606, of the thickness of the material layer of the one-piece conductor element 607 and of the thickness of the second dielectric material layer 608 is noted "e". These thicknesses should respect certain conditions. Thus, it is desirable that:

the sum of the thickness of the selector active layer 606 and of the material layer of the one-piece conductor element 607 is strictly less than the thickness "h" of the first dielectric material layer 603 so that the one-piece conductor element 607 can have an "L" shape after the anisotropic etching step 404.

the sum of the thicknesses "e" is strictly less than the thickness "h" of the first dielectric material layer 603 so that the trenches are not filled after the three depositions.

The material used for the second dielectric material layer 608 is for example SiN, $SiO_2$, SiC, SiON, SiCN or SiHN.

Figure 8:
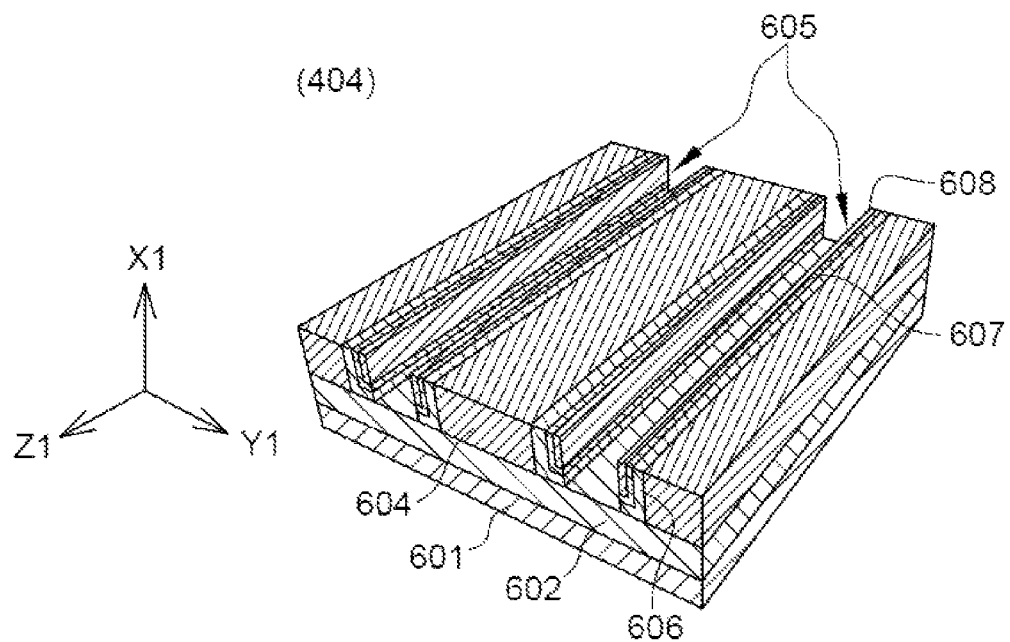

The step 404 of anisotropic etching represented in FIG. 8 consists in carrying out an anisotropic etching along the direction $\vec{Z1}$ on the second dielectric material layer 608. At the bottom of the trenches 605, this etching enables a stoppage on the conductor material layer of the lower electrode of the selector device 602 and on the parts 604 of the first dielectric material layer that have not been etched during the etching step 402, a stoppage on the first dielectric layer 603. There is no etching on the sides of the trenches 605 which thus remain orthogonal to the bottom of the trenches 605. This anisotropic etching is, for example, a dry etching of RIE (Reactive Ion Etching) type.

Figure 9:
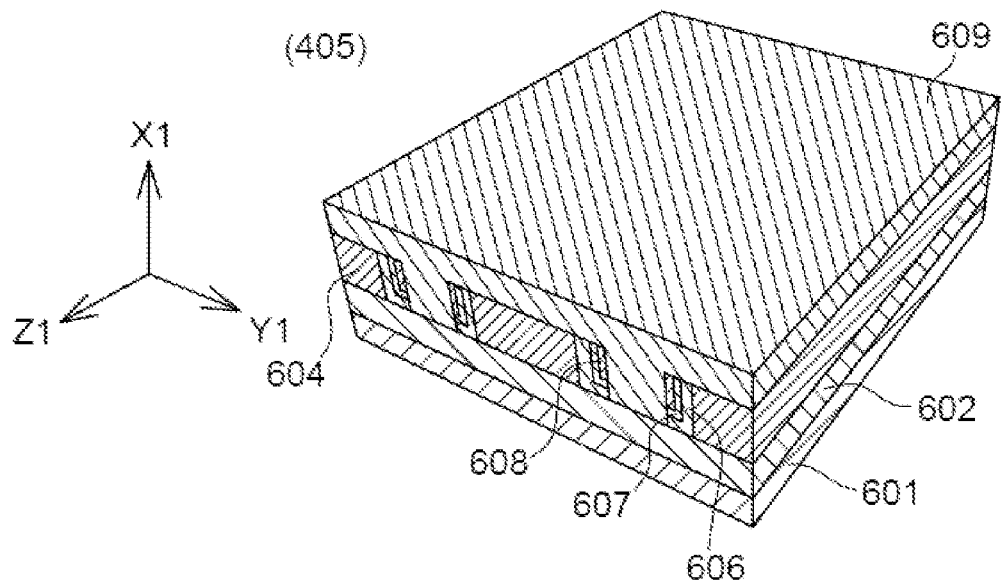

The filling step 405 represented in FIG. 9 consists in filling the trenches 605 etched previously and covering the parts 604 of the first dielectric material layer not having been etched at the etching step 402 with a third dielectric material layer 609. The material of the third dielectric material layer 609 is for example SiN, $SiO_2$, SiC, SiON, SiCN or SiHN.

Figure 10:
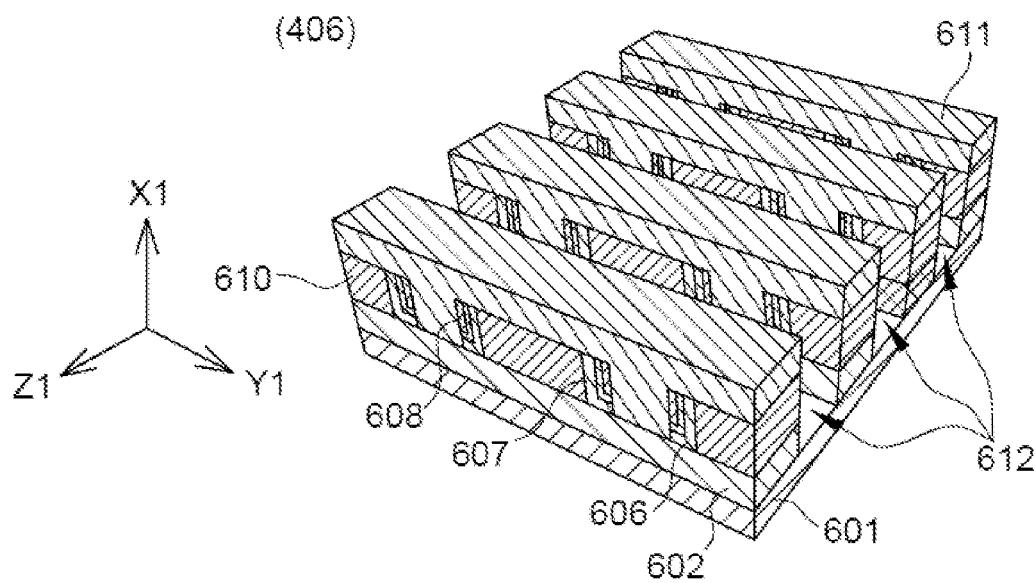

The lithography step 406 represented in FIG. 10 consists in etching several lithographic trenches 612 along a direction, here along $\vec{Y1}$, perpendicular to $\vec{Z1}$, so as to etch the conductor material layer of the lower electrode of the selector device 602, that is to say with stoppage on the substrate 601. The etching depth is substantially the same for all the lithographic trenches 612 and the sides of the lithographic trenches 612 are substantially of same height. In addition, the sides are orthogonal to the bottom of the lithographic trenches 612, sides extended along the planes containing the direction $\vec{X1}$.

Figure 11:
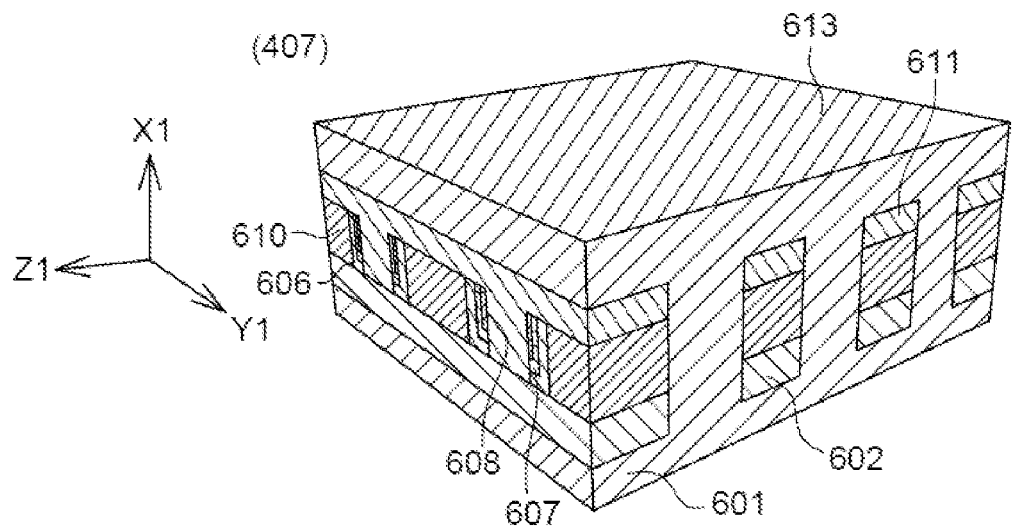

The filling step 407 represented in FIG. 11 consists in filling the lithographic trenches 612 and covering the parts 611 of the third dielectric material layer not having been etched with a fourth dielectric material layer 613. The dielectric material of the fourth dielectric material layer 613 is for example SiN, $SiO_2$, SiC, SiON, SiCN or SiHN.

Figure 12:
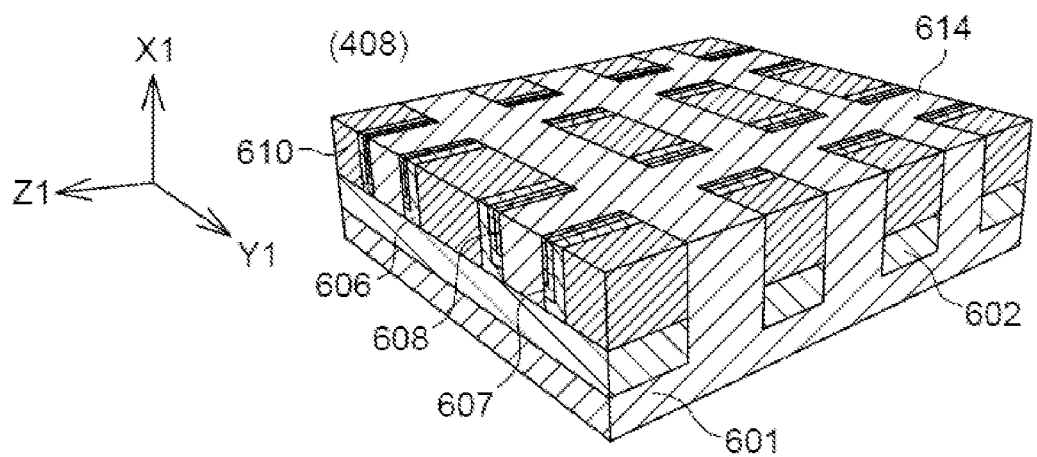

The planarization step 408 represented in FIG. 12 consists in removing material with stoppage on the parts 610 of the first dielectric material layer not having been etched during the etching step 402 and lithography step 406 so as to obtain a flat layer, in a plane containing the directions $\vec{Y1}$ and $\vec{Z1}$. The planarization is for example a planarizing polishing.

The deposition step 409 represented in FIG. 13 consists in carrying out a conformal deposition of a memory active layer 615 on the parts 610 of the first dielectric material layer not having been etched during the etching step 402 and lithography step 406 then a conformal deposition of a conductor material layer of the upper electrode of the resistive random-access memory 616 on the memory active layer 615.

A stage 600 is thereby obtained comprising a plurality of elementary cells 500, distributed along lines that correspond to the sides of the trenches 605 etched at the etching step 402 but not continually distributed on these same lines on account of the lithographic trenches 612 of the lithography step 406 which intersect perpendicularly the trenches 605 etched at the etching step 402. Thus, a cell 500 elaborated on the side of a trench 605 has a counterpart on the opposite side of the same trench 605 and is separated from another cell 500 laid out on the same side of the trench 605 by the fourth dielectric material layer 614 having served to fill the lithographic trenches 612.

To produce a second stage 600, the first dielectric material layer 603 is deposited on the conductor material layer of the upper electrode of the resistive random-access memory 616 of the first stage 600, that is to say by considering the conductor material layer of the upper electrode of the resistive random-access memory 616 of the preceding stage 600 as the conductor material layer of the lower electrode of the selector device 602 and by considering the rest of the stage as substrate 601. The same operations as for the first stage 600 are next carried out except for the fact that the etching directions are alternating, that is to say that the trenches 605 of the etching step 402 are etched along the direction $\vec{Y1}$ and the lithographic trenches 612 of the lithography step 406 along the direction $\vec{Z1}$. In other words, if the stages 600 of the matrix 700 are numbered, all the stages numbered by a multiple of 2 have trenches 605 etched at the etching step 402 along the direction $\vec{Y1}$ and the lithographic trenches 612 along the direction $\vec{Z1}$ and all the other stages have trenches 605 etched at the etching step 402 along the direction $\vec{Z1}$ and the lithographic trenches 612 along the direction $\vec{Y1}$.

A matrix 700 is a device having a plurality of stages 600.

Figure 14:
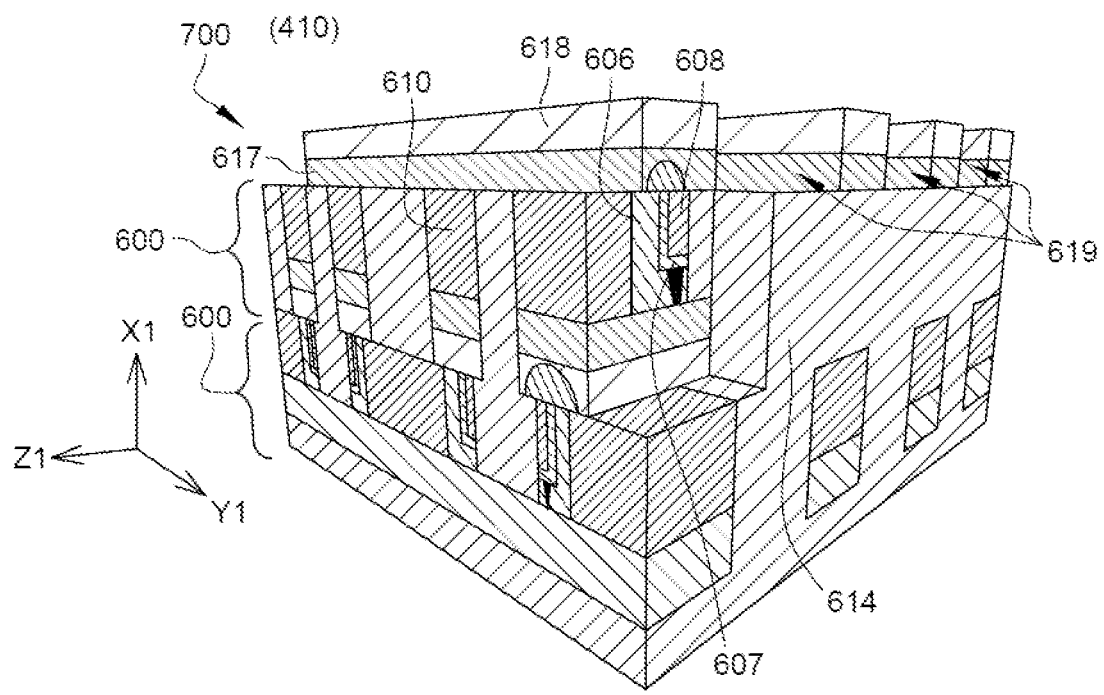
Figure 15:
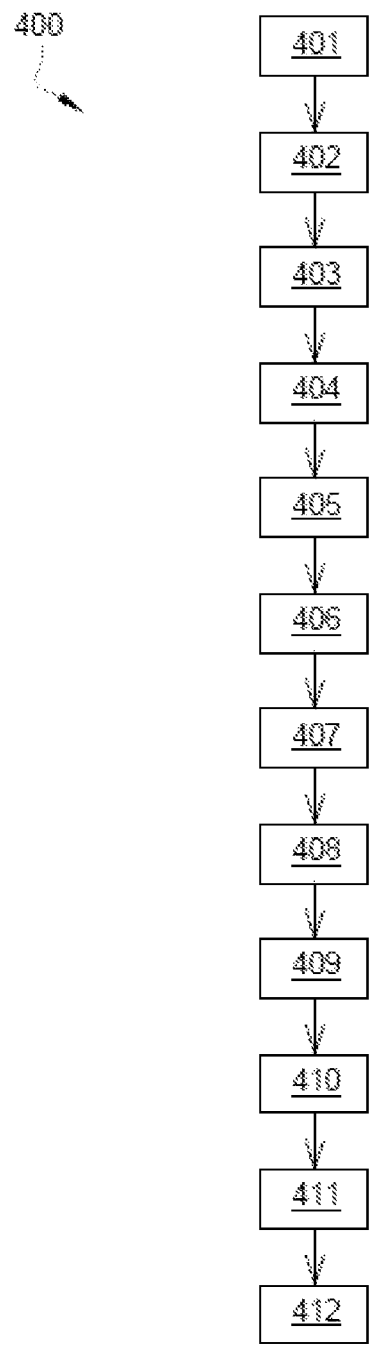
FIG. 15 shows the flow diagram of the steps of the method illustrated in FIGS. 5 to 14.

When the desired number of stages has been produced, an etching step 410 represented in FIG. 14 finalises the matrix. In the case of FIG. 14, the matrix 700 includes two stages 600. Final trenches 619 are etched in the memory active layer 615 and the conductor material layer of the upper electrode of the resistive random-access memory 616 of the final stage 600 so as to only conserve the memory active layer 615 and the conductor material layer of the upper electrode of the resistive random-access memory 616 at the level of the contact surfaces between the memory active layer 615 and the assemblies E formed of the one-piece conductor element 504 and the one-piece selector element 503 of each cell 500 of the final stage 600. The cells 500 of the final stage 600 are distributed along the sides of the trenches 605 etched at the etching step 402 for producing the final stage 600, thus the direction of etching of the final trenches 619 is the same as those of the trenches 605 produced at the etching step 402 for producing the final stage 600. In FIG. 14, the contact zones between the memory active layer 615 and the assembly E including the one-piece conductor element 504 and the one-piece selector element 503 are signalled by half-circles.

The invention claimed is:

1. An elementary cell comprising a non-volatile resistive random-access memory mounted in series with a volatile selector device, said memory comprising:
    an upper electrode of the resistive random-access memory,
    a lower electrode of the resistive random-access memory,
    a memory active layer made of a first active material,
said memory going from a high resistance state to a low resistance state by application of a threshold voltage between the upper electrode of the resistive random-access memory and the lower electrode of the resistive random-access memory, said selector device comprising:
    an upper electrode of the selector device,
    a lower electrode of the selector device,
    a selector active layer made of a second active material,
said selector device going from a high resistance state to a low resistance state by application of a threshold voltage between the upper electrode of the selector device and the lower electrode of the selector device, said selector device returning to the high resistance state as soon as the current flowing through it or the voltage at the terminals of the upper electrode of the selector device and the lower electrode of the selector device returns respectively below a holding current or voltage, said elementary cell further comprising a one-piece conductor element comprising:
    a first branch of substantially rectangular parallelepiped shape, said first branch having one face in contact with the lower surface of the memory active layer in order to form the lower electrode of the resistive random-access memory,
    a second branch of substantially rectangular parallelepiped shape, said second branch having one face in contact with the upper surface of the selector active layer in order to form the upper electrode of the selector device.

2. The elementary cell according to claim 1, wherein the selector device comprises a one-piece selector element comprising:
    a first branch of substantially rectangular parallelepiped shape, said first branch having one face in contact with one face of the first branch of the one-piece conductor element,
    a second branch of substantially rectangular parallelepiped shape constituted of the selector active layer,
in such a way that the one-piece selector element feats the outlines of the one-piece conductor element.

3. The elementary cell according to claim 1, wherein an angle between the two branches of the one-piece conductor element is substantially a right angle.

4. The elementary cell according to claim 1, wherein the selector device is of OTS, FAST or MIEC type.

5. The elementary cell according to claim 1, wherein the resistive random-access memory is of PCRAM, OxRAM or CbRAM type.

6. A stage comprising a plurality of elementary cells according to claim 1, wherein the elementary cells are distributed along several straight lines parallel with each other.

7. A matrix comprising a plurality of stages according to claim 6, wherein the stages are laid out one on top of the other and a direction of straight lines along which are distributed the elementary cells of a stage alternate from one stage to the next in such a way that the direction of the straight lines of a stage is perpendicular to a direction of the straight lines of the stage immediately below and/or above.

8. A method for manufacturing a stage according to claim 6, comprising:
a step of conformal deposition of a conductor material layer of the lower electrode of the selector device on a substrate then of conformal deposition of a first dielectric material layer on the conductor material layer of the lower electrode of the selector device;
a step of etching a plurality of trenches parallel with each other in the first dielectric material layer with stoppage on the conductor material layer of the lower electrode of the selector device;
a step of conformal deposition of a selector active layer in order to cover the trenches and the parts of the first dielectric material layer that have not been etched during the etching step, then of conformal deposition of a material layer of the one-piece conductor element on the selector active layer then of conformal deposition of a second dielectric layer on the material layer of the one-piece conductor element, in such a way that the trenches are not filled;
a step of anisotropic etching along the direction of the trenches with stoppage on the conductor material layer of the lower electrode of the selector device at the bottom of the trenches and with stoppage on the parts of the first dielectric material layer not having been etched during the etching step in order to obtain each one-piece conductor element of the elementary cells;
a step of filling with a third dielectric material layer so as to fill the trenches;
a step of lithography producing several lithographic trenches along a direction perpendicular to the direction of the trenches etched previously and in the plane of the third dielectric material layer, with stoppage on the substrate;
a step of filling with a fourth dielectric material layer so as to fill the lithographic trenches;
a step of planarization with stoppage on the parts of the first dielectric material layer not having been etched;
a step of conformal deposition of a memory active layer then of conformal deposition of a conductor material layer of the upper electrode of the resistive random-access memory on the memory active layer.

9. A method for manufacturing a matrix comprising reproducing the same steps as the method according to claim 8 for each stage of the matrix, wherein a direction of the trenches of a stage is perpendicular to a direction of the trenches of the stage immediately below and/or above.

10. The method for manufacturing a matrix according to claim 9, comprising a step of etching several final trenches along a direction of the trenches etched at the etching step for producing the final stage, etching of final trenches in the memory active layer and the conductor material layer of the upper electrode of the resistive random-access memory of the final stage so as to only conserve the memory active layer and the conductor material layer of the upper electrode of the resistive random-access memory at the level of the contact surfaces between the memory active layer and the material layer of the one-piece conductor element.

11. A method for manufacturing at least one elementary cell comprising a non-volatile resistive random-access memory mounted in series with a volatile selector device, said non-volatile resistive random-access memory comprising:
an upper electrode of the resistive random-access memory,
a lower electrode of the resistive random-access memory,
a memory active layer made of a first active material,
said non-volatile resistive random-access memory going from a high resistance state to a low resistance state by application of a threshold voltage between the upper electrode of the resistive random-access memory and the lower electrode of the resistive random-access memory, said selector device comprising:
an upper electrode of the selector device,
a lower electrode of the selector device,
a selector active layer made of a second active material, said selector device going from a high resistance state to a low resistance state by application of a threshold voltage between the upper electrode of the selector device and the lower electrode of the selector device, said selector device returning to the high resistance state as soon as the current flowing through it or the voltage at the terminals of the upper electrode of the selector device and the lower electrode of the selector device returns respectively below a holding current or voltage, the method comprising the following steps:
a step of conformal deposition of a conductor material layer of the lower electrode of the selector device on a substrate then of conformal deposition of a first dielectric material layer on the conductor material layer of the lower electrode of the selector device;
a step of etching one or more trenches, the one or more trenches being parallel with each other, in the first dielectric material layer with stoppage on the conductor material layer of the lower electrode of the selector device;
a step of conformal deposition of the selector active layer in order to cover each trench and the parts of the first dielectric material layer that have not been etched during the etching step, then of conformal deposition of a material layer of the one-piece conductor element on the selector active layer then of conformal deposition of a second dielectric layer on the material layer of the one-piece conductor element, in such a way that each trench is not filled;
a step of anisotropic etching along a direction of the one or more trenches with stoppage on the conductor material layer of the lower electrode of the selector device at the bottom of the one or more trenches and with stoppage on the parts of the first dielectric material layer not having been etched during the etching step in order to obtain at least one one-piece conductor element;
a step of filling with a third dielectric material layer so as to fill the one or more trenches;
a step of lithography producing at least one lithographic trench along a direction perpendicular to the direction of the one or more trenches etched previously and in the plane of the third dielectric material layer, with stoppage on the substrate;
a step of filling with a fourth dielectric material layer so as to fill the at least one lithographic trench;
a step of planarization with stoppage on the parts of the first dielectric material layer not having been etched;
a step of conformal deposition of a memory active layer then of conformal deposition of a conductor material layer of the upper electrode of the resistive random-access memory on the memory active layer.

* * * * *